(12) United States Patent
Shin (10) Patent No.: US 7,268,625 B2
(45) Date of Patent: Sep. 11, 2007

(54) METHOD AND APPARATUS FOR A LINEAR TRANSCONDUCTANCE DEVICE

(75) Inventor: Young Joon Shin, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 212 days.

(21) Appl. No.: 11/109,688

(22) Filed: Apr. 20, 2005

(65) Prior Publication Data

US 2006/0055459 A1     Mar. 16, 2006

Related U.S. Application Data (60) Provisional application No. 60/609,878, filed on Sep. 15, 2004.

(51) Int. Cl.
*H03F 3/45* (2006.01)
(52) U.S. Cl. .......................... 330/261; 330/136
(58) Field of Classification Search ............... 330/136, 330/254, 261
See application file for complete search history.

(56) References Cited

U.S. PATENT DOCUMENTS 5,196,807 A * 3/1993 Fujisawa ............... 330/254

* cited by examiner

*Primary Examiner*—Steven J. Mottola
(74) *Attorney, Agent, or Firm*—Sterne, Kessler, Goldstein & Fox, P.L.L.C.

(57) ABSTRACT

A transconductance device has substantially linear characteristics. The transconductance device includes a differential pair that receives a differential input voltage signal and produces a differential output current signal and a current source coupled to the differential pair. The current source produces a current having a constant portion and a variable portion, such that the derivative of the transconductance with respect to the differential input voltage is constant across a very large range of the differential input voltage and across a very high range of frequencies of the differential input signal. This linearization technique produces no extraneous noise at the differential output current.

13 Claims, 7 Drawing Sheets

METHOD AND APPARATUS FOR A LINEAR TRANSCONDUCTANCE DEVICE

CROSS REFERENCE TO RELATED APPLICATION

This application claims benefit under 35 U.S.C. § 119(e) to U.S. Provisional Patent Application 60/609,878, filed Sep. 15, 2004, which is incorporated by reference in its entirety.

BACKGROUND

1. Field

The present invention is related to transconductance devices.

2. Related Art

Figure 1:
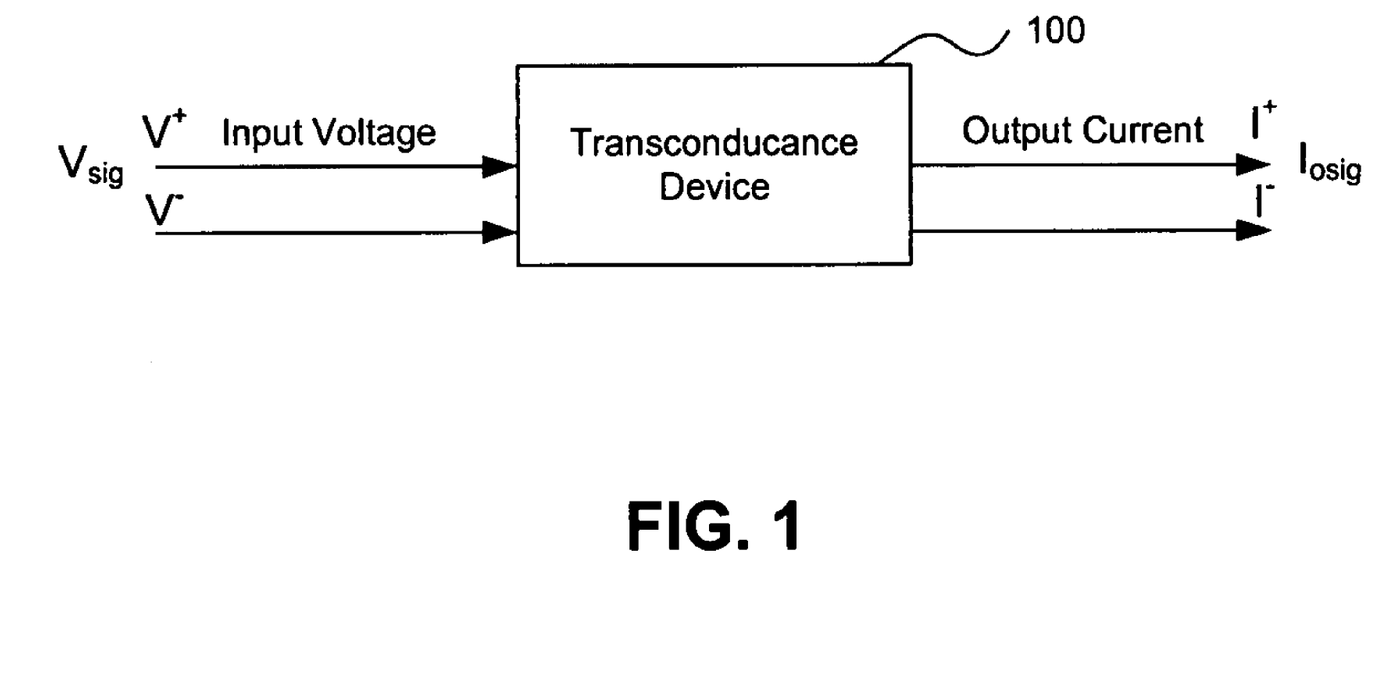
FIG. 1 shows a block diagram transconductance system.
Figure 2:
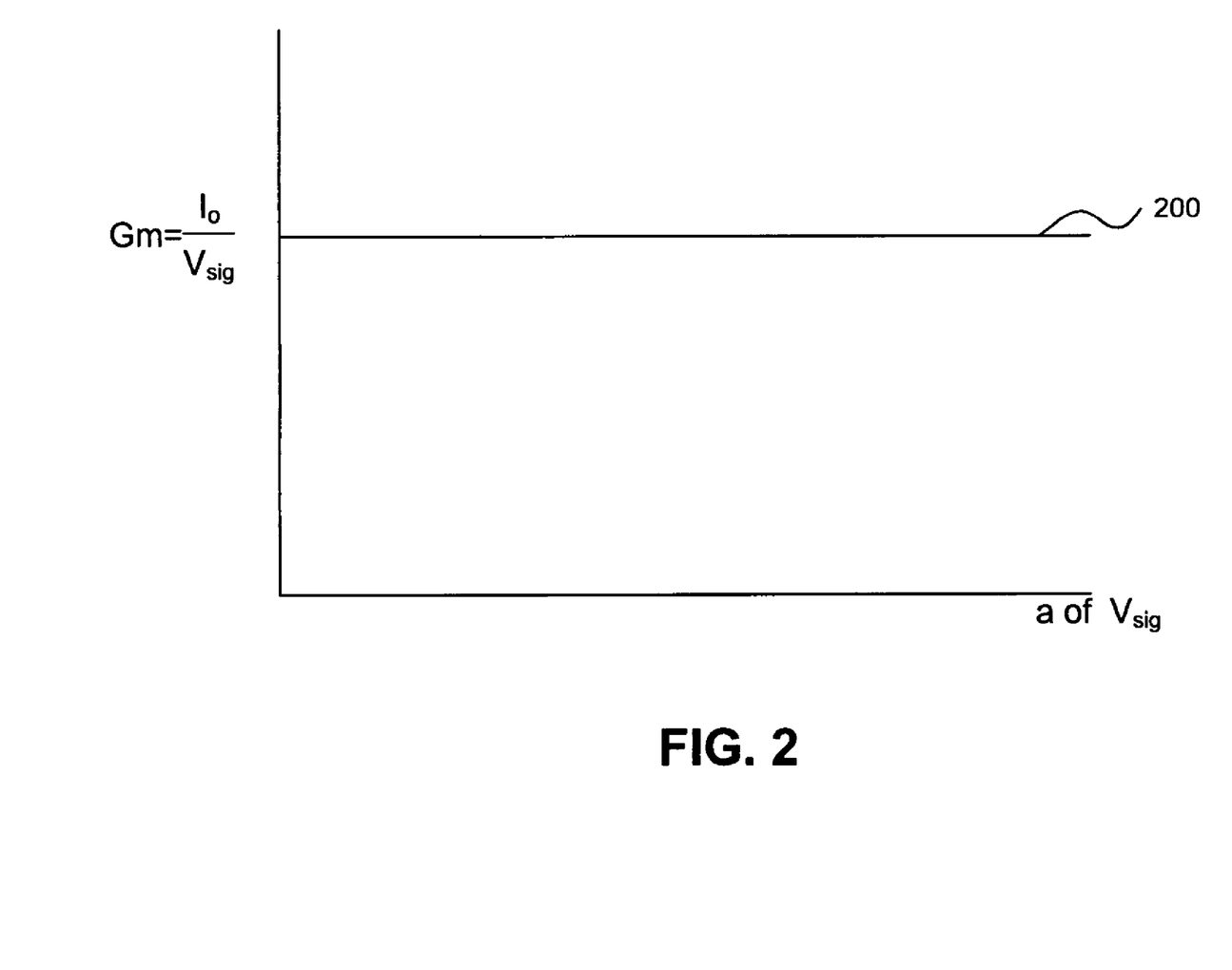
FIG. 2 shows a graph illustrating ideal transconductance linearity.

Transconductance devices are used as a basic building block in circuits to convert differential input voltage signals to differential output current signals. FIG. 1 shows a transconductance device 100 and FIG. 2 shows an ideal transconductance characteristic curve 200 over a range of differential input voltage signals Vsig. The transconductance Gm (e.g., differential output current (Io) over differential input voltage (Vsig)) is linear, if the derivative of the differential output current with respect to the differential input voltage signal Vsig is constant across all values of the differential input voltage Vsig.

In FIG. 1, the input and output node voltages are defined as follows:

$$V+ = Vcm + Vsig/2$$

$$V- = Vcm - Vsig/2$$

where Vcm is the DC common mode voltage and Vsig is the amplitude of the differential input voltage signal. The input and output node currents are defined as follows:

$$I+ = Icm + Isig/2$$

$$I- = Icm - Isig/2$$

where Icm is the DC common mode current and Isig is the amplitude of the differential output current signal.

The input differential signal which is the voltage differential of V+ and V− can be expressed as:

$$V+ - V- = Vsig$$

The output differential current which is the current differential of I+ and I− can be expressed as:

$$I+ - I- = Isig$$

A goal is to make the transconductance or Gm=Isig/Vsig constant with respect to Vsig.

However, in many circuits, transconductance devices 100 exhibit non-linear performance, which can lead to a distorted output differential current signal that is not within an allowed specification.

Therefore, what is needed is a system and method that can allow for a substantially linear transconductance characteristic in a transconductance device. This may be implemented in a device requiring relatively lower power consumption (e.g., DC common mode current or circuit current), no extraneous noise, and operation at very high frequencies (e.g., up to GHz range) compared to conventional transconductance devices.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

One or more embodiments of the present invention provides a system and method for a linear transconductance device. The system includes a pair of main transistors (e.g., a differential pair) that output a differential output current signal and set the transconductance for small differential input voltage signals and a pair of current source transistors that control the current going through the pair of main transistors. The gates of the main transistors are connected to V+ and V−, respectively. The gates of the current source transistors are connected to the output of a source follower circuit, whose input is connected to V+, and to the output of another source follower circuit, whose input is connected to V− respectively.

The voltage source (e.g., the source follower circuit) includes a transistor and a current source connected to ground. The output of the current source is connected to the source of a transistor, whose gate is tied to the input, and whose drain is connected to Vdd. The source of the transistor is the output of the source follower circuit.

In one example, for a deep NWELL process, the body of the transistor is connected to the source. The source of the transistor is tied to the output of the source follower circuit.

The DC current through the main transistors are set by the gate voltage of the pair of current source transistors, which in turn are biased by the common mode input voltage Vcm minus the gate-source voltage of the source follower circuit. The differential output current signal is formed from a current output from the main pair of transistors or the differential pair.

The current source has a constant portion and a variable portion, the variable portion increases squarely with larger differential input voltage signal. This square term enables the transconductance of the differential pair to behave linearly, e.g., as linearly as the grounded-source transconductance circuit.

For example, a third-order intermodulation distortion of the grounded source transconductance is typically 7 dB lower than that of the differential pair transconductance for the same DC current. However, by increasing the size of the pair of current source transistors relative to the size of the main pair of transistors, compensation for the decrease in the transconductance for large differential input signal in a grounded source transconductance is provided. In this example, the transconductance is substantially linear over a larger range of the input differential voltage signal as compared to the range of the input differential voltage signal for the grounded source circuit. Thus, this embodiment of the present invention decreases the third-order intermodulation distortion by 17 dB compared to that of the differential pair for the same DC current.

According to one or more embodiments of the present invention, linear grounded source devices are described. The linear grounded source devices provide a substantially linear transconductance. For example, these devices can achieve similar transconductance linearity performance as a degenerative differential pair device (described below), and at the same time without any excess noise caused by additional elements coupled to a current source portion. Also, less current is required to flow through the linear grounded source devices of the present invention compared to a degenerated differential pair, which allows for a substantial reduction in power consumption or dissipation (e.g., up to about 33%, or more). These results are based on using a current source producing a current that has both a constant portion and a variable portion, which varies relative to an input signal. Furthermore, these results can be enhanced using larger device in the current source relative to the main differential pair devices.

The above embodiments can exhibit substantially linear transconductance, require up to about 33% less power than a degenerative differential pair transconductance device, produce substantially little, if any, excess noise, operate in high signal speed environments (e.g., up to about 1 GHz systems), and have substantially little variance across process and mismatch of device parameters.

Exemplary Conventional Differential Pair Device

Figure 3:
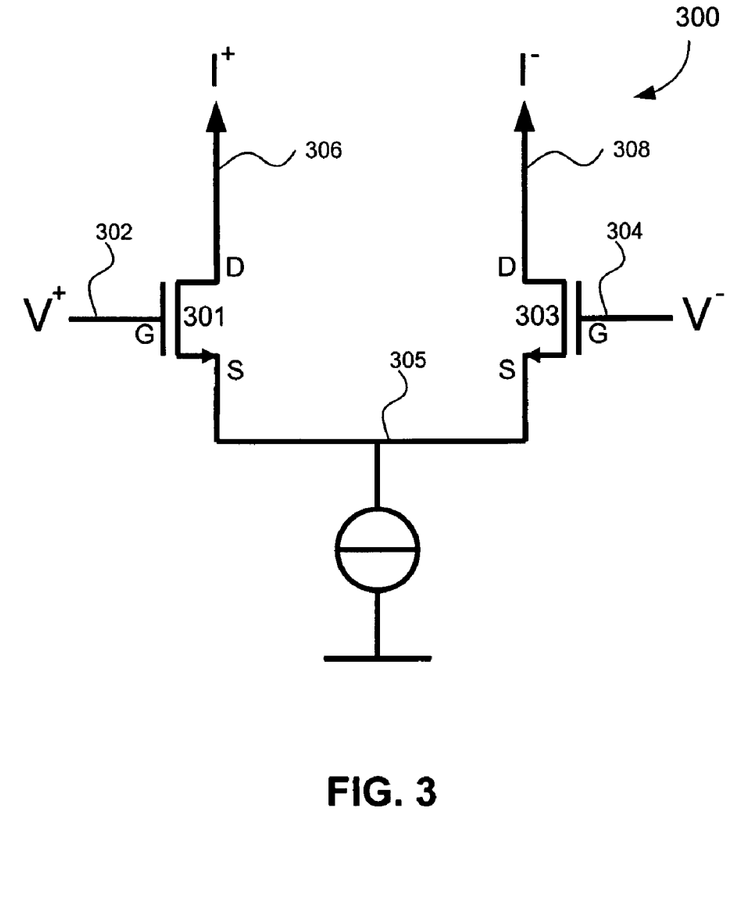
FIG. 3 shows a schematic diagram of a differential pair device.

FIG. 3 shows a differential device 300, according to one embodiment of the present invention. For example, differential device 300 can be a differential amplifier, or the like. Differential device 300 includes first and second transistors 301 and 303, which is an example of transconductance device 100. Input voltages V+ 302 and V− 304 are received at gates G of the differential pair of transistors 301 and 303 (e.g., complementary metal oxide silicon (CMOS) devices). Output currents I+ 306 and I− 308 are generated at the drains D of the transistors 301 and 303. A constant current source is coupled to a common source note 305 coupling the sources of transistors 301 and 303.

Differential input voltage signals 302 and 304 can be mathematically represented as follows:

$$V+=Vcm+\tfrac{1}{2}Vsig$$

$$V-=Vcm-\tfrac{1}{2}Vsig$$

Where Vcm is a fixed DC gate voltage of transistors 301 and 303 and Vsig is the differential input signal equal to the difference between V+ 302 and V− 304 or V+−−V=Vsig=a*sine 2πft.

Thus, differential signal Vsig can be represented as follows:

$$Vsig=a\text{ sine }2\pi ft=V+-V-=(Vg+Vsig/2)-(Vg-Vsig/2)$$

The differential output current of the differential pair is given by:

$$Iosig=I+-I-=\tfrac{1}{2}*K*Vsig*\text{sqrt}[((4*Ics)/K)-Vsig^2]$$

This assumes that first and second transistors 301 and 303 follow a CMOS square law equation, i.e., $I=\tfrac{1}{2}K(Vgs-Vt)^2$, where Vgs=Vg−Vs, Vg is voltage at gate of transistors 301 and 303 respectively, Vs is a voltage at the source, Ics is a fixed current source, and K is equal to μ(Cox)(W/L). Node 302 is V+ and is also Vg or gate voltage of transistor 301 and node 304 is V− and is also Vg or gate voltage of transistor 303.

μ is physical constant known as an electron mobility constant of electrons in an induced n channel through transistors 301 and 303.

Cox is an oxide capacitance of an oxide layer at the gate G of each transistor 301 and 303 (the capacitance per unit area of the gate-to-body capacitor for which the oxide layer serves as a dielectric).

W is the width of the channel of each transistor 301 and 303 and L is the length of the channel of each transistor 301 and 303.

The transconductance characteristic given by Iosig will not be constant as in FIG. 2 with respect to Vsig and hence non-linear because of the square root term.

Exemplary Conventional Grounded Source Device

Figure 4:
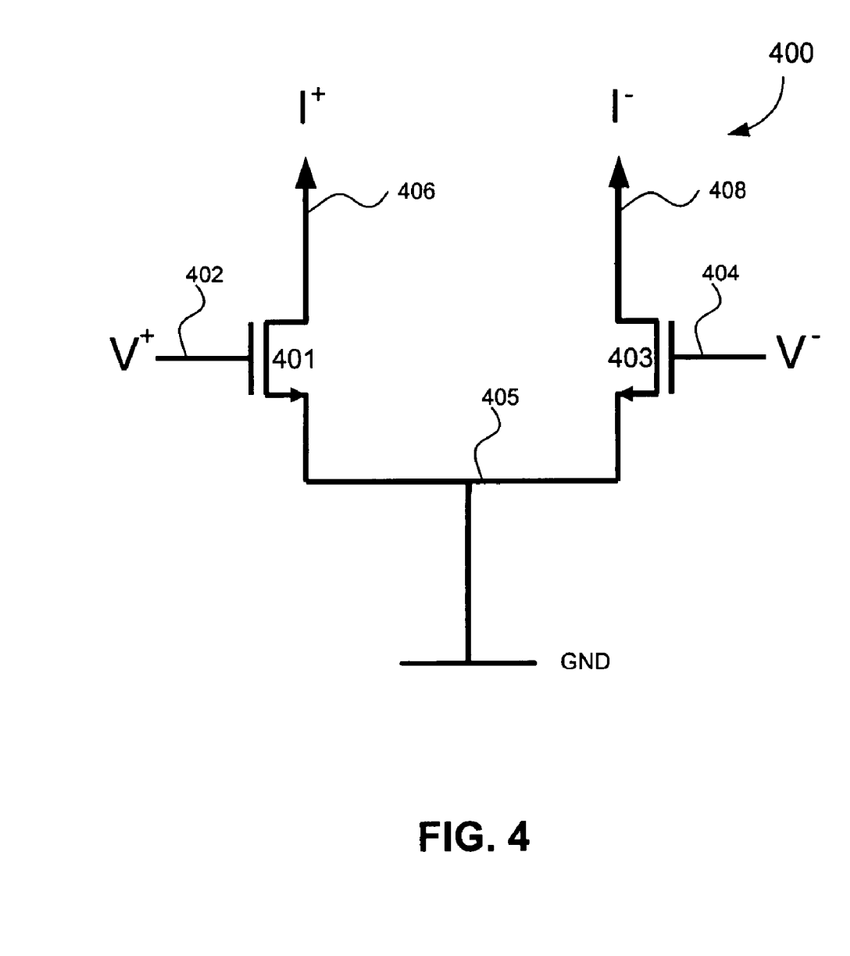
FIG. 4 shows a schematic diagram of a grounded source device.

FIG. 4 is a grounded source circuit 400, according to one embodiment of the present invention. In one example, a grounded source circuit 400 has a more linear transconductance than that of a differential pair 300. If the transistors 401 and 403 follow the ideal characteristics of the square law, however, the differential output current Iosig can be substantially linear, as it will be explained below.

Current through transistor 401 is:

$$I+=\tfrac{1}{2}*K*(V+-Vt)^2=\tfrac{1}{2}*K*Vgt^2+K*Vgt*(Vsig/2)+\tfrac{1}{2}*K*(Vsig/2)$$

Current through transistor 403 is:

$$I-=\tfrac{1}{2}*K*(V--Vt)^2=\tfrac{1}{2}*K\ Vgt^2-K*Vgt*(Vsig/2)+\tfrac{1}{2}*K*(Vsig/2)$$

Thus, the differential output current is:

$$Iosig=I+ - I- = K*Vgt*Vsig.$$

Vgt=Vgs−Vt, where Vgs=Vg−Vs. If it is assumed that the transistors 401 and 403 are based on the ideal square law, differential output current increases linearly with Vsig. Thus, the transconductance, Iosig/Vsig is constant=K*(Vgs−Vt) over an entire range of the differential input voltage signal Vsig, as shown in FIG. 2. However, transistors 401 and 403 usually do not follow the ideal square law characteristic discussed above. Thus, the transconductance of the grounded source exhibits a non-linear characteristic. As shown in curve 672 of FIG. 6, the transconductance drops as Vsig is increased, but shows smaller derivative of transconductance as a function of Vsig and hence is more linear compared to the differential pair(curve 670).

Exemplary Common Source Emulator

Figure 5:
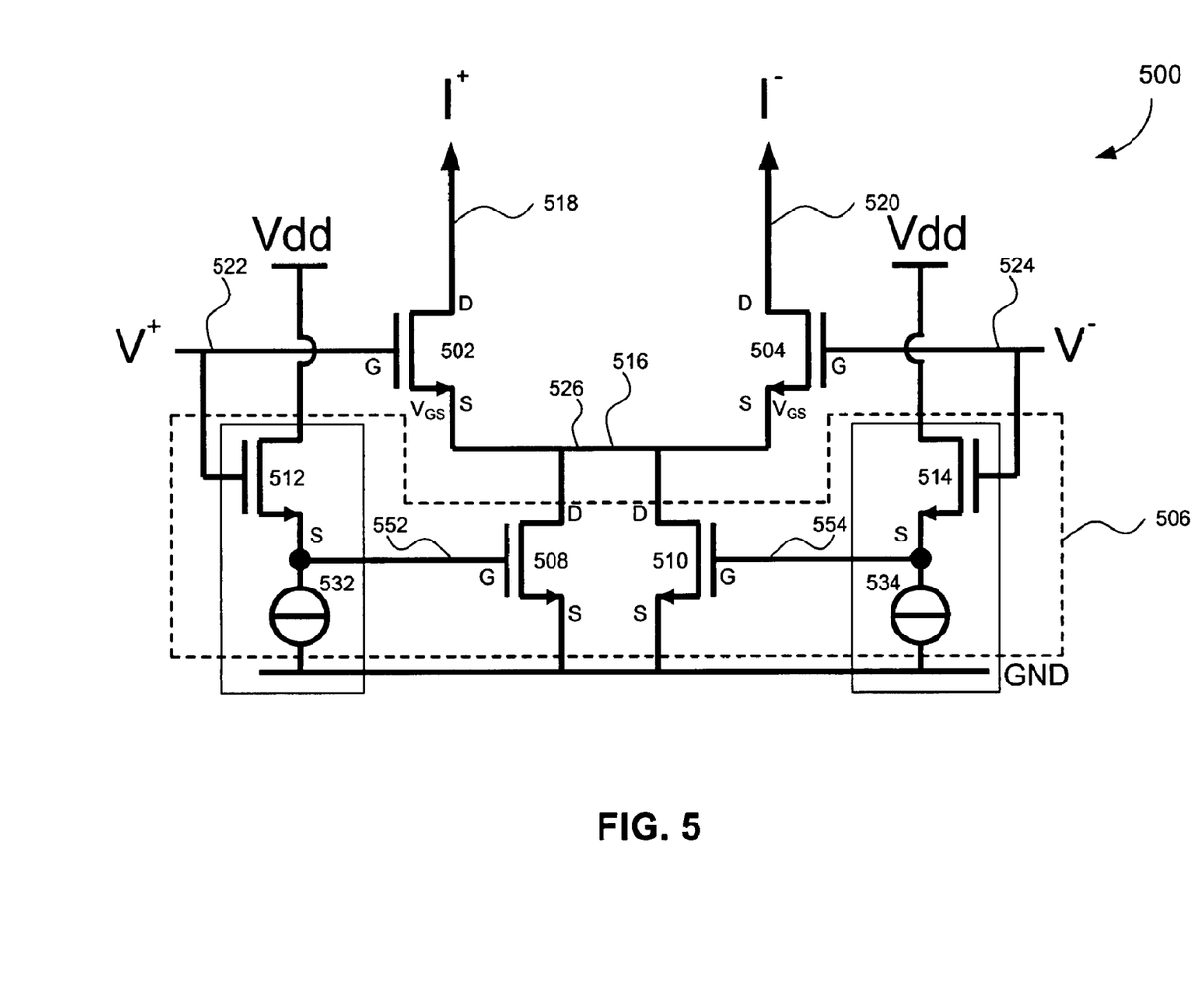
FIG. 5 shows a schematic diagram of the transconductance devices according to various embodiments of the present invention.

FIG. 5 shows a schematic diagram of a transconductance device 500, according to one embodiment of the present invention. Device 500 includes a differential pair 502 and 504 (e.g. pair of transistors) and a current source 506. Current source 506 includes first and second devices 508 and 510 (e.g., transistors) and first and second voltage sources (e.g., configured as source follower circuits) 512 and 514.

Gates of differential pair 502 and 504 are biased by differential input voltages V+ 522 and V− 524. Drains D of differential pair 502 and 504 transmit an output current signal Iosig (I+ and I−). Sources of differential pair 502 and 504 are coupled together at node 516, and to drains of current source 506, i.e., drains of devices 508 and 510.

Again, drains D of first and second transistors 508 and 510 are coupled to sources S of transistors 502 and 504, and sources S of first and second devices 508 and 510 are coupled to ground (GND). The gate G of device 508 is biased with a voltage signal 552, which is voltage signal V+ 522 adjusted down by the voltage value of voltage source 512(or the Vgs of transistor 512). Similarly, the gate G of device 510 is biased with a voltage signal 554, which is voltage signal V− 524 adjusted down by the voltage value of voltage source 514.

The drains D of sources 512 and 514 are coupled to a bias source Vdd. The sources S of transistors 512 and 514 are coupled to respective gates G of devices 508 and 510. The gates G of transistors 512 and 514 are coupled to input signals V+ 522 and V− 524, respectively. The outputs of current sources 532 and 534 are coupled to respective sources S of devices 512 and 514.

The DC current through transistors 502 and 502 is biased by current source 506. The drains D of the current source 506 (e.g., transistors 508 and 510) are biased by the input common mode voltage Vcm adjusted down by the Vgs of 502/504. Voltage sources 512 and 514 are biased to keep transistors 508 and 510 in saturation.

Transconductance (Gm) of device 500 is determined by dividing the differential output current Iout measured between drains D of transistors 502 and 504 (I+ 518−I− 520) by the differential input signal Vsig, which is the input voltage difference between the gates G of transistors 502 and 504 (V+ 522−V− 524).

In one example, if devices 502, 504, 508, and 510 have the same size (e.g., aspect ratio W/L), the current source 506 produces current signal Ics 526 at the drain of 508 and 510 given by:

$$Ics\ 526 = KVgt^2 + K(Vsig/2)^2 = 2I + K(Vsig/2)^2$$

where K is $\mu(Cox)(W/L)$ of devices 502, 504, 508, and 510, and I is the constant bias current of devices 502, 504, 508, and 510.

As shown in equations for I+ and I−:

$$I+ = \frac{1}{2}*K*(V+ - Vt)^2 = \frac{1}{2}*K*Vgt^2 + K*Vgt*(Vsig/2)$$

$$I- = \frac{1}{2}*K*(V- - Vt)^2 = \frac{1}{2}*K*Vgt^2 - K*Vgt*(Vsig/2)$$

$2I+K(Vsig/2)^2$ is the common current needed in I+ 518 and I− 520 for the differential output current Iout=I+−I− to be equal to a perfectly linear expression given by equation:

$$Iosig = I+ - I- = K*Vgt*Vsig.$$

Hence, emulating the grounded source transconductance large-signal behavior.

Figure 6:
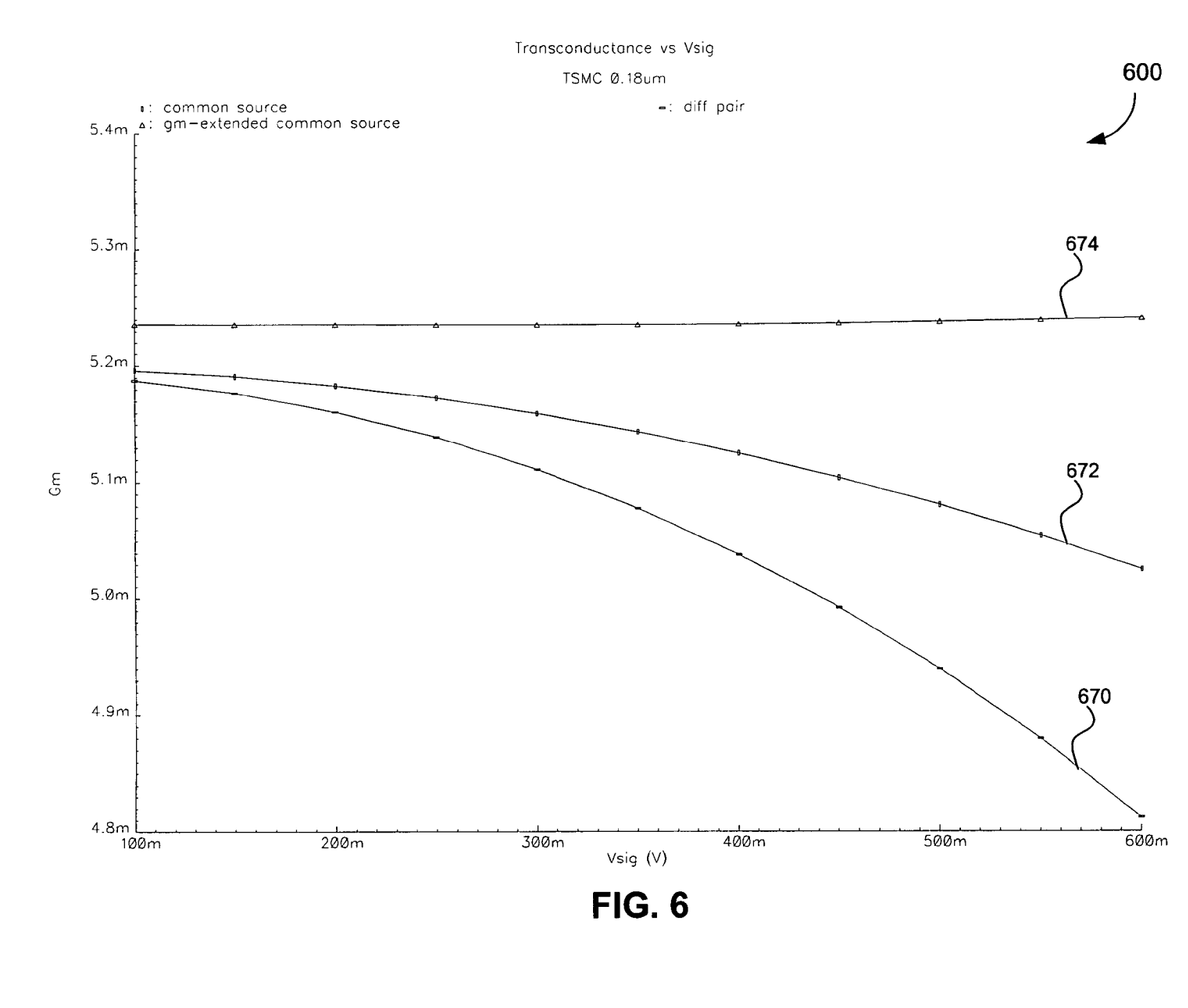
FIG. 6 is a graph illustrating a comparison between transconductance exhibited by exemplary transconductance devices according to embodiments of the present invention and conventional transconductance devices.

In FIG. 6, curve 672 shows the characteristics of the grounded source emulator when devices 502, 504, 508, and 510 have the same W/L in device 500. Curve 672 shows a much improved transconductance characteristics curve as compared to the transconductance curve of device 300 as is more linear over a wider range of Vsig as compared to curve 670 related to device 300. As described herein, this improvement is based on generating the common current Ics necessary for the differential pair device to emulate the grounded source transconductor device.

In one example, devices 508 and 510 have larger aspect ratio W/L than devices 502 and 504. Thus, the new common current Ics 526 is given by:

$$Ics\ 526 = 2I + K_2(Vsig/2)^2$$

where $K_2$ is the $\mu(Cox)(W/L)_{508,510}$ and where $(W/L)_{508,510} > (W/L)_{502,504}$.

In this example, the gain of the common current Ics as a function of Vsig, and increases as Vsig increases. Thus, the resulting transconductance curve for device 500 is extended over wider range of Vsig compared to the case where devices 502, 504, 508, and 510 all have the same W/L.

Referring again to FIG. 6, curve 674 shows the characteristics of the transconductance of linear grounded source device 500 when devices 508 and 510 have larger aspect ratio W/L than devices 502 and 504. Curve 674 is more linear over a wider range of Vsig compared to curves 672 and 670.

In one example, current source 506 does not contribute to noise on the output differential current Iosig=I+−I−.

Thus, transconductor circuit 500, e.g., a linear grounded source circuit, produces a differential output current signal that is much more linear, with respect to the differential input voltage signal, than a grounded source circuit or a differential pair circuit. Furthermore, the linear grounded source circuit technique enables operation at very high frequencies, e.g., up to the GHz range.

Figure 7:
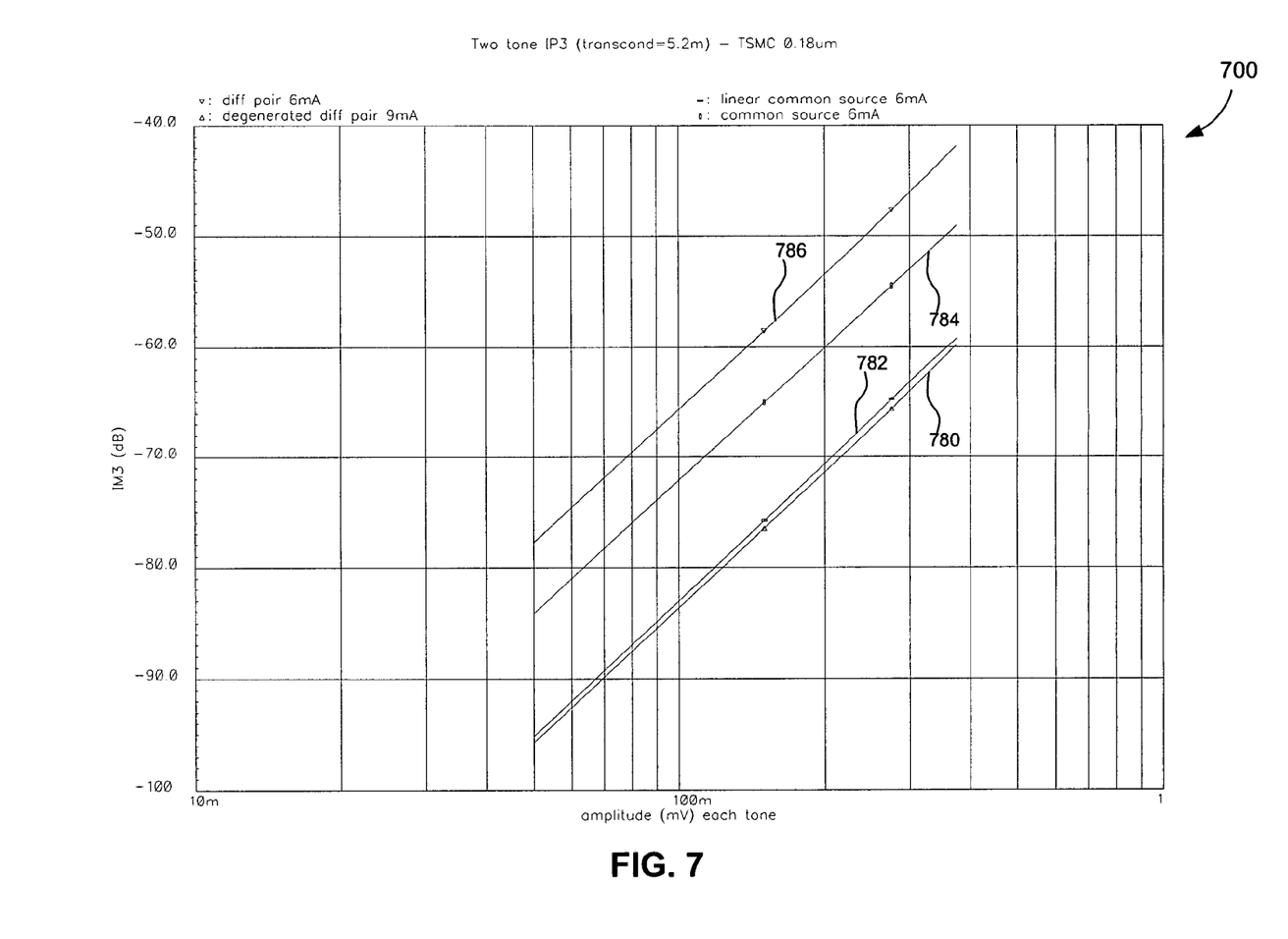
FIG. 7 is a graph illustrating a comparison of the third-order intermodulation distortion exhibited by exemplary transconductance devices according to embodiments of to the present invention and that by conventional transconductance devices The present invention will now be described with reference to the accompanying drawings. In the drawings, like reference numbers may indicate identical or functionally similar elements. Additionally, the left-most digit(s) of a reference number may identify the drawing in which the reference number first appears.

FIG. 7 is a graph 700 illustrating third order inter modulation (IM3) values in dB versus amplitude of each tone in mV for transconductance devices 300, 400, and 500, according to one embodiment of the present invention. In graph 700, a lower IM3 value is desired because a lower IM3 value corresponds to more linearity in transconductance device performance.

The lowest IM3 value in graph 700 is shown as curve 780, which shows the characteristics of a degenerated differential pair device. In this example, the degenerated differential pair device is biased with 9 mA from current source I.

The next lowest IM3 value, which is almost equal to curve 780, is curve 782 for linear grounded source device 500, which is biased with 6 mA. Thus, according to embodiments of the present invention, device 500 can be configured to exhibit almost identical characteristics as a degenerated differential pair device, while using less power (where power consumption corresponds to required bias current; e.g., 9 mA for the degenerated differential pair device versus 6 mA for device 500). For example, in embodiments, about 33% less power may be used by device 500 as compared to the degenerated differential pair device.

The next lowest IM3 curve is curve 784, which shows characteristics for a grounded source device. In the present example, the grounded source device 400 is biased with 6 mA.

Finally, the highest IM3 value is for a differential pair device 300 shown in curve 786, which is biased with 6 mA from current source I. Thus, device 300 exhibits the least linearity, as compared to device 500.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor(s), and thus, are not intended to limit the present invention and the appended claims in any way.

What is claimed is:

1. A device, comprising:
   a differential transistor pair that receives a differential input voltage signal and outputs a differential output current signal; and
   a current source that is coupled to a common source node of the differential transistor pair, the current source producing a current having a constant portion and a variable portion, wherein the variable portion of the current increases squarely with respect to the differential input voltage signal.

2. The device of claim 1, wherein the differential pair comprises:
   a first transistor; and
   a second transistor, wherein the first and second transistors are complementary metal oxide semiconductor (CMOS) devices.

3. The device of claim 1, wherein the current source comprises:
   first and second current source transistors; and
   first and second voltage sources,
   wherein each gate in the current source transistors is biased by an input common mode voltage (Vcm) adjusted down by the Vgs of a corresponding one of the first and second voltage source.

4. The device of claim 3, wherein the first and second voltage sources each comprise a transistor configured as a source follower circuit.

5. The device of claim 3, wherein each of the first and second voltage sources comprise:
   a transistor; and
   a current source,
   wherein a gate of the transistor is coupled to the input,
   wherein a drain of the transistor is coupled to a first voltage, and
   wherein a source of the transistor is coupled to the current source.

6. The device of claim 3, wherein:
   a width to length ratio (W/L) of a gate of the first and second current source transistors is larger than a W/L of a gate of transistors of the differential transistor pair.

7. A method in a differential amplifier for a substantially linear transconductance characteristic, comprising:
   (a) receiving a differential input voltage signal at gates of a differential transistor pair, wherein source terminals of the differential transistor pair are coupled together at a common source node;
   (b) generating a common current having a constant portion and a portion that increases squarely with respect to an increase in the differential input voltage signal, wherein the common current is generated by a current source having a second transistor pair, wherein a K of the second transistor pair is larger than a K of the differential transistor pair;
   (c) receiving the generated common current at the common source node; and
   (d) outputting a differential output current signal at drain terminals of the differential pair.

8. A device, comprising:
   a differential transistor pair that receives a differential input voltage signal and outputs a differential output current signal; and
   a current source that is coupled to a common source node of the differential transistor pair, the current source producing a current having a constant portion and a variable portion,
   wherein the current source comprises,
      first and second current source transistors, and
      first and second voltage sources,
         wherein each gate in the current source transistors is biased by an input common mode voltage (Vcm) adjusted down by the Vgs of a corresponding one of the first and second voltage source.

9. The device of claim 8, wherein the differential pair comprises:
   a first transistor; and
   a second transistor, wherein the first and second transistors are complementary metal oxide semiconductor (CMOS) devices.

10. The device of claim 8, wherein the first and second voltage sources each comprise a transistor configured as a source follower circuit.

11. The device of claim 8, wherein each of the first and second voltage sources comprise:
   a transistor; and
   a current source,
   wherein a gate of the transistor is coupled to the input,
   wherein a drain of the transistor is coupled to a first voltage, and
   wherein a source of the transistor is coupled to the current source.

12. The device of claim 8, wherein:
   a width to length ratio (W/L) of a gate of the first and second current source transistors is larger than a W/L of a gate of transistors of the differential transistor pair.

13. The device of claim 8, wherein the variable portion of the current increases squarely with respect to the differential input voltage signal.

* * * * *